United States Patent [19]

Robinson et al.

[11] 4,390,392

[45] Jun. 28, 1983

[54] METHOD FOR REMOVAL OF MINUTE PHYSICAL DAMAGE TO SILICON WAFERS BY EMPLOYING LASER ANNEALING

[75] Inventors: John T. Robinson, Sherman; Olin B. Cecil; Rajiv R. Shah, both of Dallas, all of Tex.

[73] Assignee: Texas Instruments Incorporated, Dallas, Tex.

[21] Appl. No.: 187,662

[22] Filed: Sep. 16, 1980

[51] Int. Cl.³ .................... H01L 21/306; B44C 1/22; C03C 15/00; C03C 25/06
[52] U.S. Cl. .................... 156/643; 156/645; 156/662; 219/121 LF
[58] Field of Search .................... 29/575, 576 T, 580; 219/121 LE, 121 LH, 121 LF, 121 LJ, 121 EJ, 121 EK, 121 LM; 156/643, 645, 662; 250/492 A; 148/191

[56] References Cited

U.S. PATENT DOCUMENTS

| | | | |
|---|---|---|---|
| 4,249,960 | 2/1981 | Schnable et al. | 219/121 LJ |
| 4,257,827 | 3/1981 | Schwuttke et al. | 219/121 LE |
| 4,258,078 | 3/1981 | Celler et al. | 427/43.1 |
| 4,276,114 | 6/1981 | Takano et al. | 156/645 |

Primary Examiner—William A. Powell
Attorney, Agent, or Firm—Douglas A. Lashmit; Melvin Sharp; N. Rhys Merrett

[57] ABSTRACT

In order to produce wafers suitable for fabrication of integrated circuits, an ingot of raw silicon must undergo a process which includes several steps. The ingot must be sawed into slices, the slices edge ground to remove roughness of the edges, lapped to remove as much saw damage as possible, stress relief etched to remove as small a damaged area as possible, then polished. Each of these steps requires removal of some of the material of the slice. The use of laser annealing reduces the amount of surface removed, as it repairs some surface damage, smoothes the surface, and when accomplished in a partial vacuum, improves the chemical composition of the material as related to electrical activity.

2 Claims, 6 Drawing Figures

METHOD FOR REMOVAL OF MINUTE PHYSICAL DAMAGE TO SILICON WAFERS BY EMPLOYING LASER ANNEALING

BACKGROUND OF THE INVENTION

This invention relates to semiconductor wafer processing, and more particularly to removal of damage to the wafer by use of laser annealing.

The processing of silicon to a form useful in fabricating integrated circuits requires use of machines such as saws, grinders, and polishers, which physically alter the shape of the silicon itself by tearing away part of it. In this tearing away, physical damage is done to the remaining surface, and even after attempts to smooth the surface by etching and polishing, small cracks and crevices exist in the material surface. These defects have a negative effect on the electrical performance of any device subsequently fabricated on the surface.

The first step in the process of wafer formation is that of sawing a silicon crystal into thin wafers. These wafers are then put on holding fixtures and edge ground to remove the roughness that may be on the edge of the wafers and to round the wafer. Next, a lapping operation removes as much saw damage to the surface as is possible, and at the same time, planarizes the surface of the wafer. The stress relief etch step is then performed, which attempts to remove micro-splits, or small stress cracks. The wafer surface is then given a final polish which removes a minute amount of the surface as a final effort at physical removal of surface damage.

Typically, each step may remove some surface damage, but may also cause damage. Therefore, some means for removal of damage remaining on the surface is needed.

It is an object of the present invention to remove minute damage to the surface of a wafer. Another object of the present invention is to denude the surface layer, of a wafer, of oxygen.

This invention may be used to eliminate a step or steps in the typical wafer process, or used between steps of the process.

The use of laser annealing to repair crystal lattice damage in silicon, caused by ion implant, has been demonstrated by Gibbons (Electronic Design, Jan. 79, pp. 23-25). The damage caused by ion implant is largely confined to a depth of less than 1 micrometer. The surface layer then does not require melting, only sufficient heat to let the lattice structure reform.

Laser annealing involves the focusing of a laser beam onto a spot, and sweeping this spot across the surface of a wafer. The concentration of enough power on a spot can cause melting of the surface layer of silicon. The desired effect on a surface may be achieved by manipulation of spot size and scan rate of the spot.

The present invention utilizes a laser to melt the surface of the wafer. To achieve a melt depth of approximately 0.5 to 1 micrometer, a laser having a wavelength of slightly more than 1 micrometer may be used, such as the $Nd^{3+}$:YAG type, which has a wave-length of 1.06 micrometers. For a deeper melt of approximately 10 micrometers, a laser having a longer wave length must be used, such as the $CO_2$ type laser, which has a wave-length of 10.6 micrometers. The laser used is either a pulsed or CW type of laser, and is focused to a spot size of 50 micrometers in diameter. The pulsed laser has a pulse duration of 50 to 150 nanoseconds typically with a pulse repetition rate of 0.05 to 50 Hz. This results in the necessary power density of 50 to 200 $MW/cm^2$. The CW laser must be operated in the Q-switched mode with pulse repetition rate of 1 to 10 KHz, and must have an average output power of 10 to 20 watts in order to achieve the necessary power density. The melting and subsequent substrate oriented recrystallization allows for removal of shallow surface damage to a depth of 1 micrometer, or removal of deeper surface damage up to 10 micrometers, and generally minimized the amount of material removal during wafer fabrication.

The present invention has an added feature in the preferred embodiment, whereby annealing is conducted with the wafer in a partial vacuum of approximately $10^{-4}$ mm of mercury, causing the surface film to be denuded of oxygen. A mostly oxygen-free surface film is superior for VLSI fabrication since no oxygen precipitation can occur due to supersaturation effects. Oxygen precipitation and related effects in the depleted region of MOS and CCD circuits are known to enhance dark currents. However, oxygen precipitation in the bulk substrate will enhance device performance by acting as a sink for fast diffusing impurities and point defects.

DESCRIPTION OF THE PREFERRED EMBODIMENT

Figure 1A:
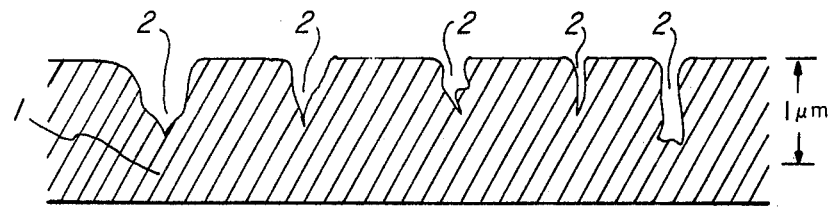
FIG. 1 shows simulated shallow damage on a silicon surface before and after subjection to laser annealing.
Figure 1B:
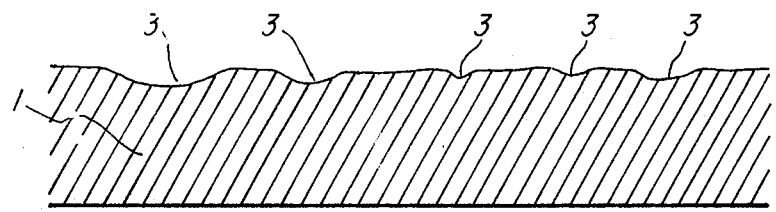

FIG. 1a is a cross section of a monocrystalline silicon wafer 1 showing residual damage 2 done in the processing. FIG. 1b shows the result of laser annealing the same wafer. The laser beam melts the surface of the wafer to a depth of 0.5 micrometer or more, allowing the damaged spots 3 to recede to the surface, or the crevices to fill up during the liquid phase of the silicon in the process. The underlying undamaged silicon acts as seed material for crystalline alignment in the liquid phase epitaxial regrowth of the top damaged layer.

Figure 2A:
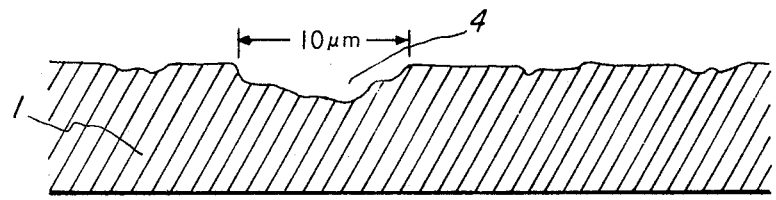
FIG. 2 shows simulated deeper damage on a silicon surface before and after laser annealing.
Figure 2B:
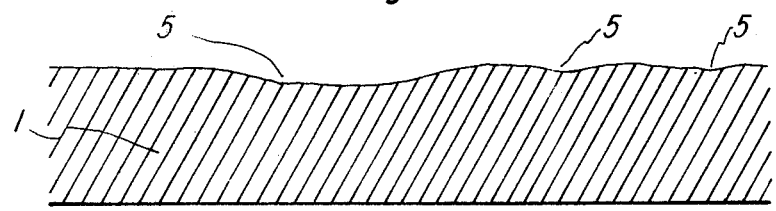

FIG. 2a is a cross section of a wafer showing the type of deeper damage of up to 10 micrometers deep 4, repairable by laser annealing. FIG. 2b shows the same damaged spots 5 after the laser annealing.

Figure 3:
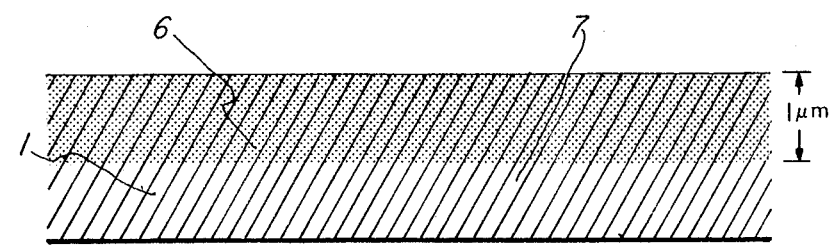
FIG. 3 shows the surface area denuded of oxygen.
Figure 4:
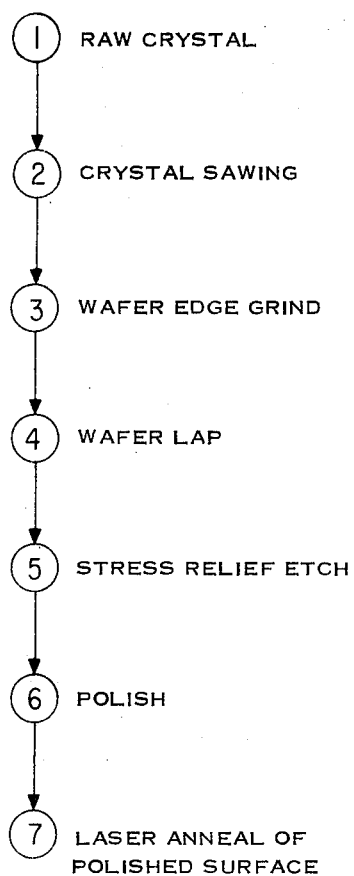
FIG. 4 shows the process sequence of wafer fabrication as taught in the present invention.

FIG. 3 shows the area 6 which would be denuded of oxygen for the case when the wafer is laser annealed in a partial vacuum. The bulk substrate 7 which is not affected by the laser retains its oxygen, and this film-substrate combination provides an optimal substrate for VLSI device fabrication.

What is claimed is:

1. A method for denuding of oxygen the surface layer of a semiconductor wafer by subjecting said surface of said semiconductor wafer to said laser beam to cause melting and recrystallization of said surface while said wafer is in a partial vacuum.

2. A process for fabrication of semiconductor wafers suitable for use in the manufacture of integrated circuits, comprising:
   (a) sawing silicon crystals into thin wafers;
   (b) edge grinding to remove roughness around the circumference of each said wafer;

(c) wafer lap to remove prominent damage and smooth out wafer surface;
(d) stress relief etch to remove small stress cracks from the surface of said wafer; and
(e) polish for final smoothing and damage removal from said surface of said wafer;
(f) subjecting the surface of said wafer to said laser beam to cause melting and recrystallization of said surface while said wafer is in a partial vacuum for removal of minute abrasive damage to said surface of said wafer, and for denuding surface layer of said wafer of a significant portion of the oxygen contained therein.

* * * * *